United States Patent [19]

Nakayama

[11] 4,258,331
[45] Mar. 24, 1981

[54] DIFFERENTIAL AMPLIFIER

[75] Inventor: Kazuaki Nakayama, Tokyo, Japan

[73] Assignee: Pioneer Electronic Corporation, Tokyo, Japan

[21] Appl. No.: 30,793

[22] Filed: Apr. 17, 1979

[30] Foreign Application Priority Data

Apr. 18, 1978 [JP] Japan .................................. 53/45638

[51] Int. Cl.³ ............................................. H03F 3/45
[52] U.S. Cl. .................................... 330/261; 330/257
[58] Field of Search ................................ 330/257, 261

[56] References Cited

U.S. PATENT DOCUMENTS 3,717,821  2/1973  Amemiya et al. .................... 330/257

*Primary Examiner*—James B. Mullins
*Attorney, Agent, or Firm*—Sughrue, Rothwell, Mion, Zinn and Macpeak

[57] ABSTRACT

An improved differential amplifier includes a pair of PNP transistors $Q_1$ and $Q_2$, in which an input signal on a signal input terminal IN is applied to the base of the transistor $Q_1$. The base of an NPN transistor $Q_5$ is connected to the base of the transistor $Q_1$ to absorb the base current of the transistor $Q_1$. A load circuit comprising a transistor $Q_6$ and a variable resistor $R_5$ is connected in series to the transistor $Q_5$ and a current mirror circuit is coupled to the differential amplifier. The load circuit implements current mirror operation together with the current mirror circuit, whereby the input terminal voltage of the differential amplifier is maintained at substantially zero potential when no input signal is received irrespective of the variations of power source voltages.

3 Claims, 1 Drawing Figure

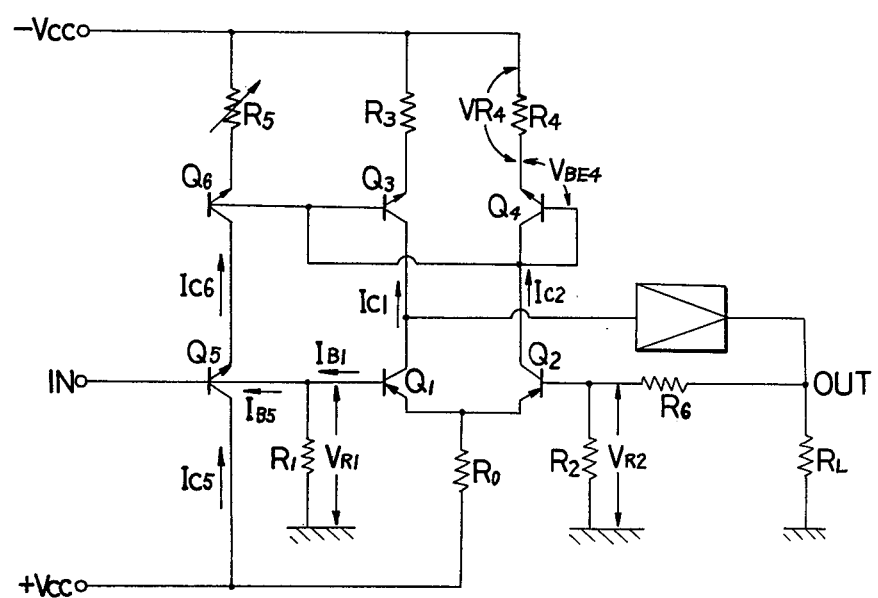

DIFFERENTIAL AMPLIFIER

BACKGROUND OF THE INVENTION

This invention relates to an improved differential amplifier wherein the input terminal voltage of the differential amplifier is maintained at substantially zero potential regardless of the variations of power source voltages when no input signal is received.

Conventionally, a differential amplifier comprising a pair of transistors has been proposed, in which a signal input terminal is derived from the base of the first amplifier transistor. A compensation transistor is coupled to the base of the first amplifier transistor for absorbing the base current of the first amplifier transistor. This type of differential amplifier is indicated at page 73 of "OPERATIONAL AMPLIFIERS Design And Applications" published by McGRAW-HILL KOGADUSHA, LTD. In such a differential amplifier, a resistor is connected to the emitter of the compensation transistor and the amount of current absorbed from the base of the first amplifier transistor is controlled by adjusting the resistance of the resistor associated with the compensation transistor. Accordingly, in the case where the voltages in positive and negative power sources are independently varied, the collector current of the compensation transistor and the collector currents of the amplifier transistors are individually varied. These variations individually vary the base currents of the compensation transistor and the first amplifier transistor, with the result that the input terminal voltage of the differential amplifier fluctuates from the zero voltage level and thus the applied input signal is to be superimposed on the input terminal voltage being varied. Consequently, the compensation transistor does not operate to completely absorb the base current of the first transistor when the power source voltages are varied.

SUMMARY OF THE INVENTION

Accordingly, an object of the present invention is to provide an improved differential amplifier eliminating the above-mentioned drawback. Briefly, and in accordance with the present invention, the base of a compensation transistor whose polarity is opposite to the first amplifier transistor is connected to the base of the first amplifier transistor to absorb the base current of the first amplifier transistor. A load circuit comprising a transistor and a variable resistor is connected in series to the compensation transistor, which implements current mirror operation together with a current minor circuit coupled to the differential amplifier. Hence, the input terminal voltage of the differential amplifier is maintained at substantially zero potential when no input signal is received regardless of the variations of the power source voltages.

BRIEF DESCRIPTION OF THE DRAWING

The single FIGURE is a circuit diagram showing one preferred embodiment according to the present invention.

DETAILED DESCRIPTION OF THE PREFERRED EMBODIMENT

A preferred embodiment according to the present invention will now be described with reference to the accompanying drawing.

In a single FIGURE, PNP transistors $Q_1$ and $Q_2$ constitute a differential amplifier wherein the commonly connected emitters of the transistors $Q_1$ and $Q_2$ are connected through a resistor $R_0$ to a positive power source $+V_{cc}$. The base of the transistor $Q_1$ is connected to a signal input terminal IN via an NPN transistor $Q_5$ which will be described later on. One terminal of an input resistor $R_1$ is connected to the line between the bases of the transistors $Q_1$ and $Q_5$ while the other terminal thereof is grounded. The collector of the transistor $Q_1$ is connected to the next stage amplifier whose output is connected to one terminal of a load resistor $R_L$ having the other terminal being grounded. The output of the amplifier system as shown is derived from an output terminal OUT. A resistor $R_6$, the transistor $Q_2$ and $Q_1$, and the next stage amplifier constitute a negative feedback circuit for compensating thermal drift of the transistor $Q_1$. The collectors of the transistors $Q_1$ and $Q_2$ are connected to the collectors of NPN transistors $Q_3$ and $Q_4$, respectively. The base of the transistor $Q_4$ is connected to the collector of the same transistor and to the base of the transistor $Q_3$, thereby constituting a current mirror circuit. The emitters of the transistors $Q_3$ and $Q_4$ are connected to a negative power source $-V_{cc}$ through resistors $R_3$ and $R_4$, respectively. The transistor $Q_5$ is provided for absorbing the base current of the transistor $Q_1$, and whose emitter is connected to the collector of the transistor $Q_6$, base to the base of the transistor $Q_1$ and collector to the positive power source $+V_{cc}$. The emitter of the transistor $Q_6$ is connected through a variable resistor $R_5$ to the negative power source $-V_{cc}$. The base of the transistor $Q_6$ is connected to the bases of the transistors $Q_3$ and $Q_4$, thereby constituting a current mirror circuit together with the transistors $Q_3$ and $Q_4$.

The operation of the differential amplifier thus constructed will next be described. The base potential $V_{R2}$ of the transistor $Q_2$ is supplied by a resistor $R_2$ whose one terminal is connected to the base of the transistor $Q_2$ and whose other terminal is grounded. The base potential $V_{R2}$ of the transistor $Q_2$ is maintained approximately zero voltage because the resistance of the resistor $R_2$ is small. The collector current $I_{C5}$ of the transistor $Q_5$ is approximately equal to the collector current $I_{C6}$.

Due to the current mirror operation implemented by the transistors $Q_4$ and $Q_6$, the following relationship is established:

$$I_{C5}=(R_4/R_5)\cdot I_{C2} \qquad \ldots (1)$$

where $I_{C2}$ is the collector current of the transistor $Q_2$.

On the other hand, when no input signal is received, there is a relationship of $I_{C1}=I_{C2}$. Further, with respect to the transistors $Q_5$ and $Q_2$, the following equations can be established:

$$I_{C5}=h_{FE5}\cdot I_{B5} \qquad \ldots (2\text{-}1)$$

$$I_{C1}=I_{C2}=h_{FE1}\cdot I_{B1} \qquad \ldots (2\text{-}2)$$

where $h_{FE5}$ and $h_{FE1}$ represent d.c. current amplification ratios of the transistors $Q_5$ and $Q_1$, respectively. By substituting equations (2-1) and (2-2) for equation (1), the following can be obtained.

$$h_{FE5}\cdot I_{B5}=(R_4/R_5)\, h_{FE1}\cdot I_{B1} \qquad \ldots (1')$$

Provided that the base current $I_{B1}$ of the transistor $Q_1$ and the base current $I_{B5}$ of the transistor $Q_5$ are equal to each other, there will be no current flow in the resistor $R_1$ and thus the voltage $V_{R1}$ of the input terminal become zero. Therefore, this can be implemented by adjusting the variable resistor $R_5$ so as to satisfy the following relationship:

$$(R_4/R_5) = (h_{FE5}/h_{FE1}) \quad \ldots (3)$$

In the case where the negative power source voltage is varied, since an impedance of the transistor $Q_2$ viewed from the negative power source is large, the sum of the base-emitter voltage $V_{BE4}$ of the transistor $Q_4$ and the voltage $V_{R4}$ across the resistor $R_4$ is substantially not varied, so that the collector current $I_{C2}$ of the transistor $Q_2$ is not varied. Accordingly, due to the current mirror operation, the collector currents $I_{C1}$ and $I_{C6}$ of the transistors $Q_1$ and $Q_6$ are not varied in due course. As a consequence, the base current $I_{B1}$ of the transistor $Q_1$ is completely absorbed by the transistor $Q_5$ and thus the input terminal voltage $V_{R1}$ is not caused to be varied. On the other hand, in the case where the positive power source voltage is varied, if a constant current source is connected between the commonly connected emitters of the transistors $Q_1$ and $Q_2$ and the positive power source $+V_{cc}$, the base currents $I_{B1}$ and $I_{B5}$ are not varied. In order to reduce the cost, however, the resistor $R_0$ is employed in this embodiment in lieu of the current source. In this case, since the resistance of the common emitter resistor $R_0$ is not infinite, the collector current $I_{C2}$ of the transistor $Q_2$ is varied. The base currents $I_{B5}$ and $I_{B1}$ of the transistors $Q_5$ and $Q_1$ are represented by the following equations.

$$I_{B5} = (I_{C5}/h_{FE5}) = (1/h_{FE5}) \cdot (R_4/R_5) \cdot I_{C2} \quad \ldots (4)$$

$$I_{B1} = (I_{C1}/h_{FE1}) = (I_{C2}/h_{FE1}) \quad \ldots (5)$$

From equation (3), since $(1/h_{FE5}) \cdot (R_4/R_5) = (1/h_{FE1})$, the base current $I_{B1}$ of the transistor $Q_1$ is equal to the base current $I_{B5}$ of the transistor $Q_5$. Therefore, the input terminal voltage $V_{R1}$ is maintained zero voltage.

As can be appreciated from the above description, it can be understood that the input terminal voltage is maintained zero potential regardless of the voltage variations in the positive and negative power sources.

As is apparent, according to the present invention, the input terminal voltage of the differential amplifier is not varied by the variations of the power sources. Further, even though a ripple component is superimposed on the d.c. voltage of the power source, the differential amplifier according to the present invention rejects such a ripple component. This means that a filter provided in the power source can be simplified without causing any inconvenience in the operation of the differential amplifier.

Although the present invention has been described with respect to a specific embodiment, it will be appreciated by one skilled in the art that a variety of changes may be made without departing from the scope of the invention.

What is claimed is:

1. In a differential amplifier comprising a pair of first and second transistors of the same polarity wherein a base of said first transistor is connected to a base of a compensation transistor whose polarity is opposite to the polarity of said first transistor, the improvement comprising a current mirror circuit coupled to said differential amplifier and a load circuit connected in series to said compensation transistor, said load circuit implementing current mirror operation together with said current mirror circuit, whereby a base current of said first transistor is completely absorbed by said compensation transistor.

2. The differential amplifier as claimed in claim 1, wherein said load circuit comprises a transistor and a resistor.

3. The differential amplifier as claimed in claim 1 or 2, wherein said first transistor is a PNP transistor and said compensation transistor is an NPN transistor.

* * * * *